United States Patent [19]

Hsia et al.

[11] Patent Number: 5,870,407
[45] Date of Patent: Feb. 9, 1999

[54] METHOD OF SCREENING MEMORY CELLS AT ROOM TEMPERATURE THAT WOULD BE REJECTED DURING HOT TEMPERATURE PROGRAMMING TESTS

[75] Inventors: Edward Hsia, San Jose; Jose H. Hernandez, Milpitas, both of Calif.; Sayan Suanya, Bangkok, Thailand

[73] Assignee: Advanced Micro Devices, Inc., Sunnyvale, Calif.

[21] Appl. No.: 653,211

[22] Filed: May 24, 1996

[51] Int. Cl.$^6$ .................................................. G11C 29/00
[52] U.S. Cl. ...................... 371/21.1; 371/21.2; 371/21.3; 371/21.4; 365/201
[58] Field of Search .................................. 371/21.1, 21.2, 371/21.4, 21.3; 365/201, 189.07

[56] References Cited

U.S. PATENT DOCUMENTS

| | | | |
|---|---|---|---|
| 4,418,403 | 11/1983 | O'Toole et al. | 365/201 |
| 4,809,231 | 2/1989 | Shannon et al. | 365/201 |
| 4,903,265 | 2/1990 | Shannon et al. | 371/21.4 |
| 4,958,324 | 9/1990 | Devin | 365/201 |
| 5,200,920 | 4/1993 | Norman et al. | 365/201 |
| 5,237,535 | 8/1993 | Mielke et al. | 365/218 |
| 5,467,309 | 11/1995 | Tanaka et al. | 365/185.14 |
| 5,500,823 | 3/1996 | Martin et al. | 365/201 |
| 5,511,021 | 4/1996 | Bergemont et al. | 365/185.03 |
| 5,515,318 | 5/1996 | Cappeletti et al. | 365/185.09 |
| 5,523,972 | 6/1996 | Rashid et al. | 365/185.22 |
| 5,566,125 | 10/1996 | Fazio et al. | 365/45 |
| 5,596,526 | 1/1997 | Assar et al. | 365/185.17 |
| 5,610,867 | 3/1997 | DeBrosse et al. | 365/201 |

*Primary Examiner*—Hoa T. Nguyen
*Attorney, Agent, or Firm*—H. Donald Nelson

[57] ABSTRACT

In a semiconductor manufacturing process for manufacturing memory devices a method of screening hot temperature programmability rejects in memory devices during wafer sort at room temperature that would be rejected at class test at high temperature. All cells in the memory device are subjected to a first sequence of programming pulses at a voltage lower than the standard programming voltage. The number of pulses in the first sequence of programming pulses is from 1–5. Those die that verify as having been successfully programmed are passed. Those die that do not verify as having been programmed are subjected to a second sequence of programming pulses at a voltage lower than the standard programming voltage. The number of pulses in the second sequence of programming pulses is from 10 to 15 pulses. Those that verify as being programmed are marked as good and those that do not are repaired and retested.

16 Claims, 5 Drawing Sheets

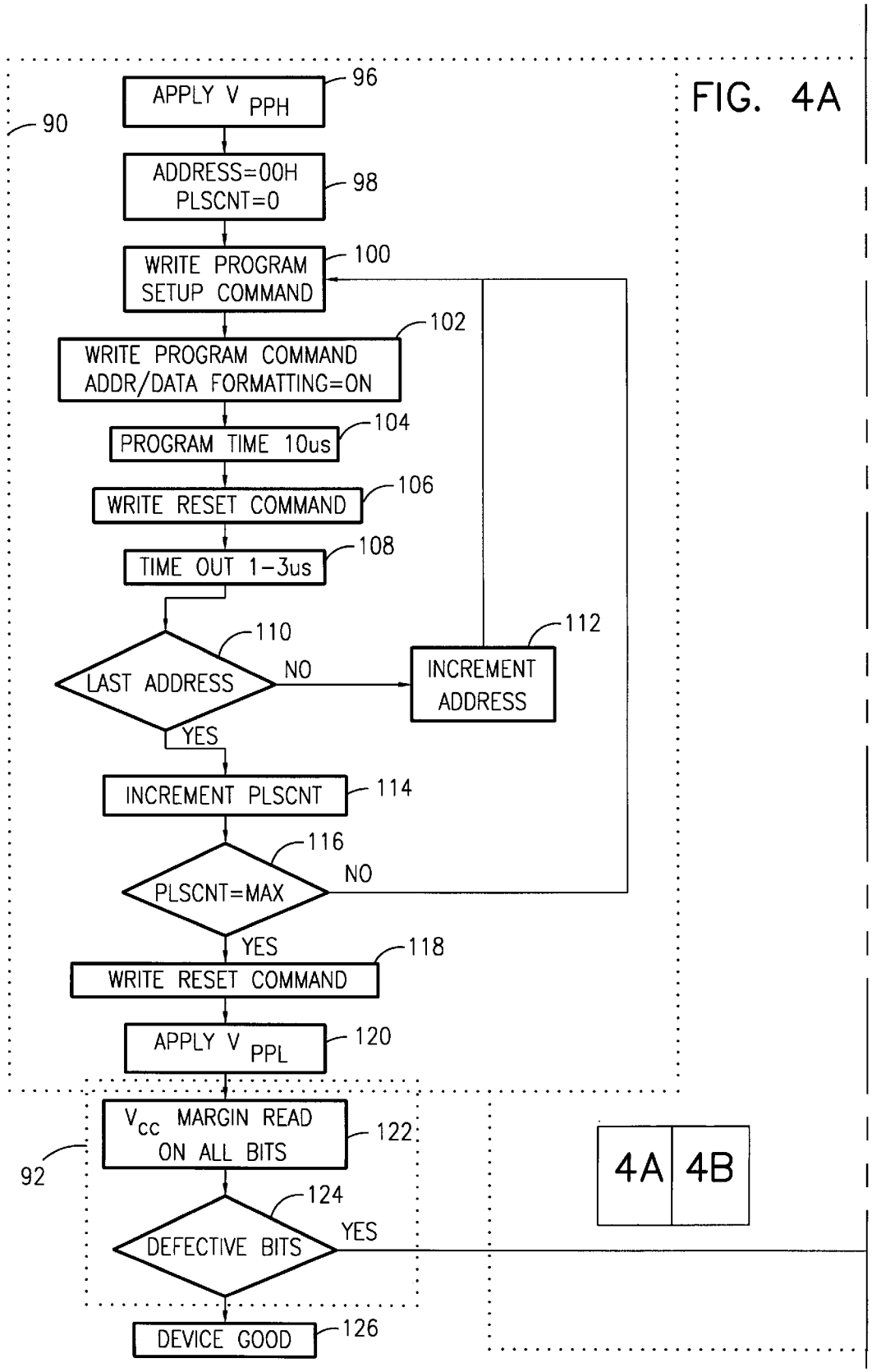

METHOD OF SCREENING MEMORY CELLS AT ROOM TEMPERATURE THAT WOULD BE REJECTED DURING HOT TEMPERATURE PROGRAMMING TESTS

BACKGROUND OF THE INVENTION

1. Field of the Invention

This invention relates generally to the testing of Flash memory devices and, more particularly, to a test method of screening out Flash memory devices during wafer sort conducted at room temperature that would be hot temperature programming rejects discovered during class tests conducted at elevated temperature.

2. Discussion of the Prior Art

This application is related to application, Ser. No. 08/655,337 entitled "Method of Screening Hot Temperature Erase Rejects at Room Temperature" and application, Ser. No. 08/653,227 entitled "Method of Utilizing Redundancy Testing To Substitute for Main Array Programming and AC Speed Reads" both applications having a common assignee with this application and filed on the same date as this application.

The standard test method used for Flash memory devices includes testing at the wafer level and testing after each individual die has been packaged. The wafer level testing is commonly done at room temperature and is called wafer sort. The package level testing is done after the wafer has been sawed into single die and encapsulated in a package which is typically plastic. The package level testing is commonly called final test or class test and is done at an elevated temperature, usually from 70–130 degree Centigrade. Once the package level or class test is complete the Flash memory devices that pass the class test are marked and shipped to the customer.

The wafer sort is used to remove or screen-out the die that have a defect or defects which occur during the fabrication of the Flash wafer. The wafer sort is used to ensure that only those die that have a possibility of being shipped to a customer are encapsulated in a package. This is done to control the package cost since bad die are not packaged.

Presently, the class testing is still necessary since the wafer sort is done at room temperature and some die are sensitive to operations at elevated temperatures and there were no known tests that could be conducted during wafer sort which is conducted at room temperature that could screen programming rejects that would be discovered at elevated temperature testing. The operations that are most sensitive to elevated temperatures are speed sorting (a sort that determines the speed of the Flash memory device), programming, and certain low level leakage current testing. In addition, a part of class testing is to ensure that the encapsulation process did not damage the die.

A programming operation changes the logic state of a cell from a "1" (called "blank") to a logic "0" (called "programmed"). The programming and read operations are done at the byte level, that is, 8 cells (bits) at a time, on the Flash memory devices. The erase operation changes the logic of the cell to a "1" or blank state. The erase operation is done on all cells in the array at the same time. To prevent "over-erasure" of an individual cell, all cells must be programmed to a logic "0" before the erase operation. Over-erasure of a cell can cause problems during subsequent programming and read operations and in some cases would prevent the cell from being programmed. The Flash memory device must have all cells at a logic "1" when transferred to the class testing or when shipped to a customer. This means that if any cell is read as programmed, that is, read at a logic "0" then all cells must be programmed to a logic "0", read, erased, and reread to ensure all cells are blank, that is, are at a logic "1". Presently, this must be done at both wafer sort and class test.

One of the problems encountered is that the cells are not exactly the same, that is, some cells either program or erase faster or slower than others. It is necessary, therefore, to provide a series of programming pulses or erase pulses to a device. The key to a good device is that all cells in the device can be programmed or erased by being subjected to a series of program pulses or erase pulses with the number of pulses being within an acceptable range.

The wafer sort and class test require lengthy test sequences due to the large number of memory cells that need to be read, programmed, read again, erased, and read again. The number of cells in a Flash memory device is commonly on the order of 1–2 million cells. It is expected that this number will increase in the future.

What is needed is a test methodology that can be conducted at room temperature during wafer sort that can successfully screen out those Flash memory devices that would be rejected during elevated temperature programming testing during class test, thus negating the requirement to repeat the lengthy testing sequence during class test. The advantage of such a test methodology would be that (1) test time for each good Flash memory device would decrease leading to lower product cost, (2) class test yields would increase since elevated temperature programming rejects would not be packaged and subjected to class testing which would result (3) in lower overall packaging cost.

SUMMARY OF THE INVENTION

In accordance with the present invention a method is provided for screening hot temperature programmability rejects at room temperature in a semiconductor memory manufacturing process. All cells in the memory device are subjected to a first sequence of programming pulses at a voltage lower than the standard programming voltage for the device. The number of pulses in the first sequence of programming pulses is from 1 to 5 pulses. The devices that verify as having been successfully programmed are passed and are not further tested for programmability in either the wafer sort or class test. Those devices that do not verify as having been programmed are subjected to a second sequence of programming pulses at a voltage lower than the standard programming voltage for the device. The number of pulses in the second sequence of programming pulses is from 10 to 15 pulses. Those devices that verify as being programmed are marked as good and those that do not are repaired and retested.

The present invention is better understood upon consideration of the detailed description below, in conjunction with the accompanying drawings. As will become readily apparent to those skilled in this art from the following description there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The accompanying drawings incorporated in and forming a part of the specification, illustrate the present invention, and together with the detailed description below serve to explain the principles of the invention. In the drawings.

DETAILED DESCRIPTION

Figure 1:
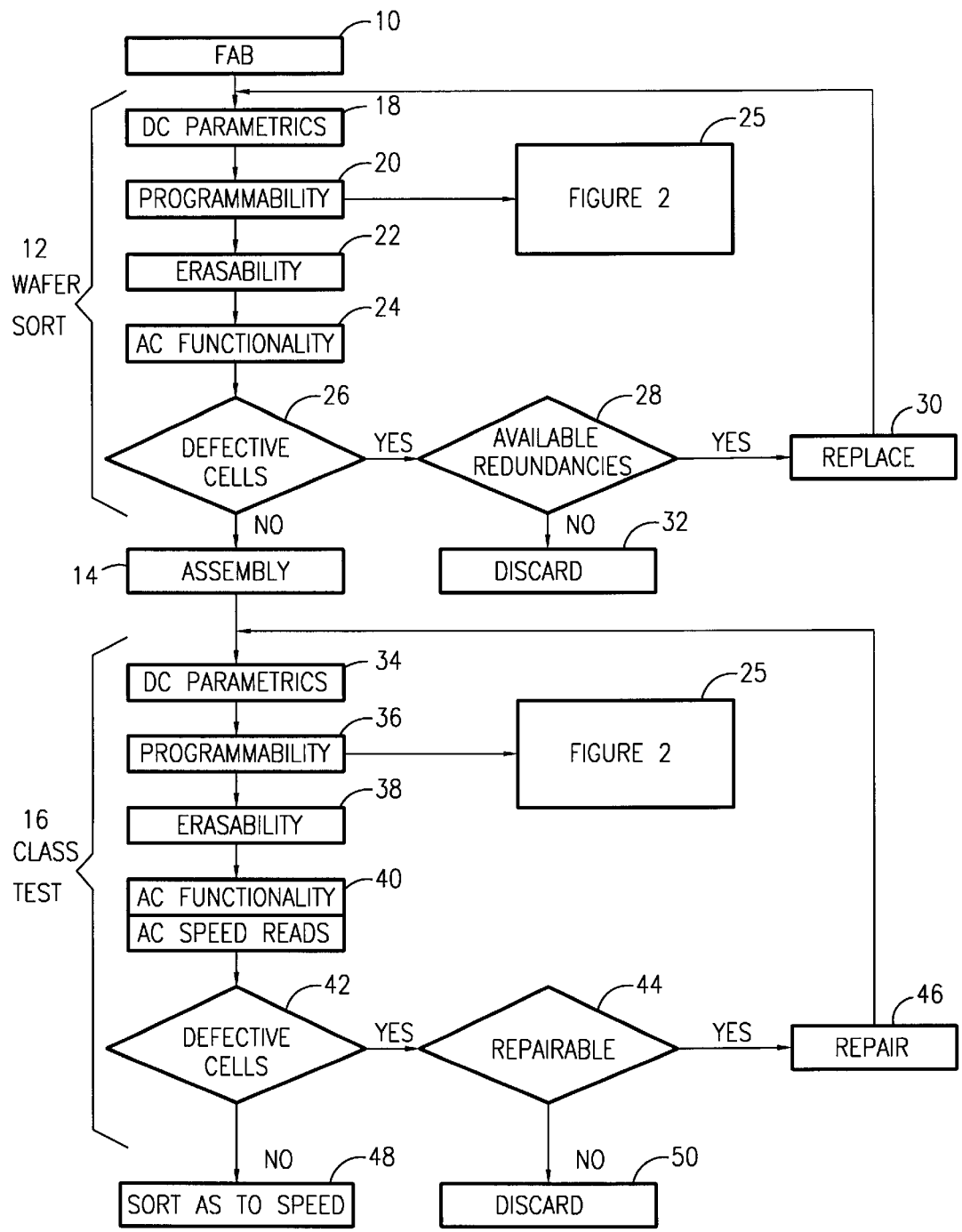
FIG. 1 shows the prior art testing method for Flash memory devices.

Referring now to FIG. 1 there is shown the prior art method of testing Flash memory devices. The manufacture of Flash memory devices can be informally divided into four overall processes. The first process is represented in FIG. 1 as fab 10 which represents the actual fabrication of the Flash memory device in wafer form. The next major process is referred to as wafer sort 12 which will be discussed below. The third major process is referred to as the assembly process 14 and represents the process in which the wafer is sawed into individual die and each non-defective die, as determined in wafer sort 12, is packaged. The fourth major process is referred to as class test 16 and will be discussed below.

Figure 2:
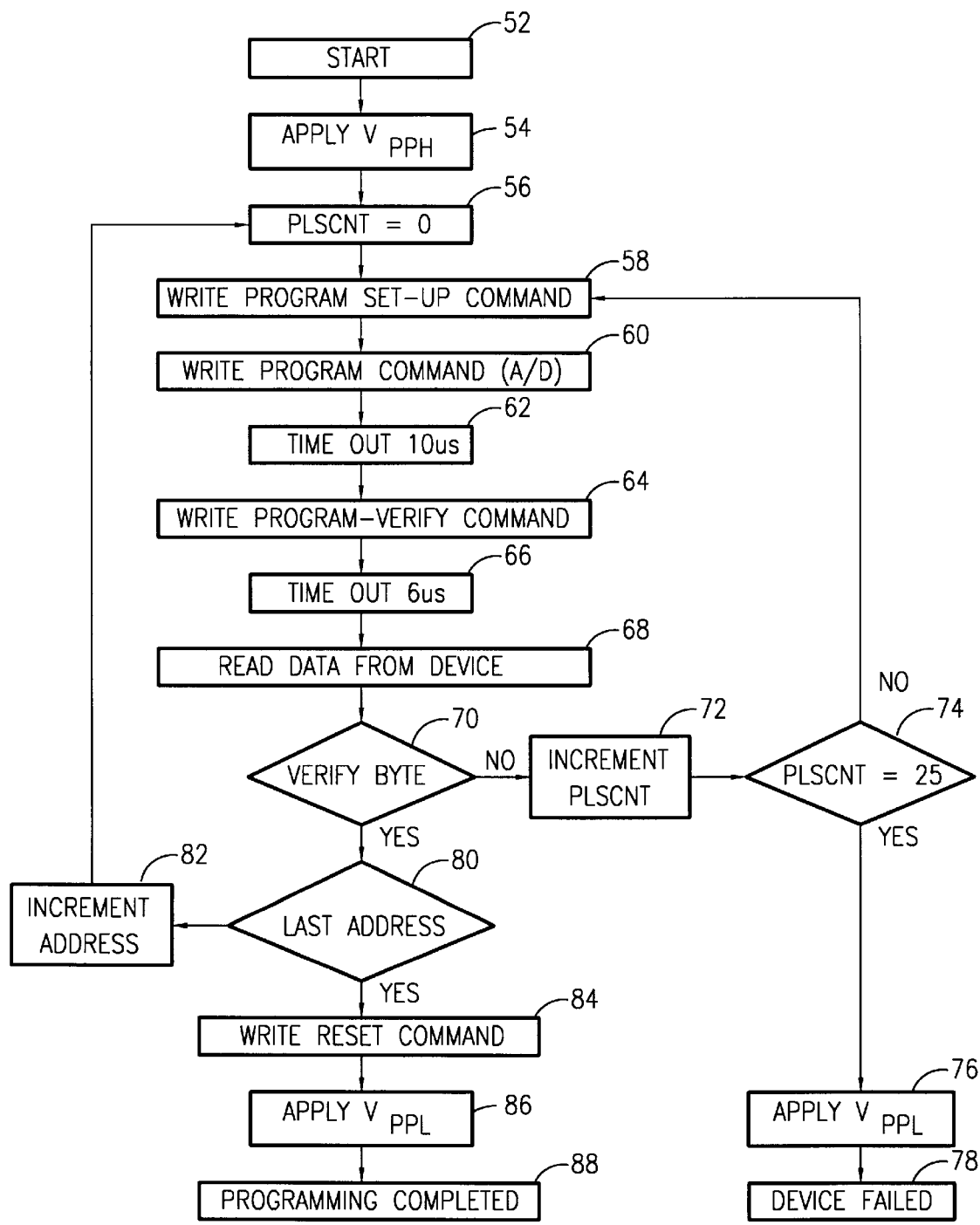
FIG. 2 shows the prior art method for testing for programming failures.

The major tests performed in wafer sort 12 are the tests referred to as dc parametrics 18 for each cell which include testing for dc continuity, shorts, leakage current tests, etc., the programmability 20 of each cell, the erasability 22 of each cell, and the ac functionality 24 of each cell. The programmability algorithm utilized in programmability 20 testing in wafer sort 12 is shown in FIG. 2 as represented by box 25 and will be discussed below.

It has become the standard practice to manufacture Flash memory devices with a main array section and a redundancy array section. The redundancy array section is a section comprising cells that are identical to the cells in the main array section and are used to replace defective cells identified in the main array during wafer sort. For example, the Advanced Micro Devices part Am28F020 is a 2 Megabit Flash memory device and is organized as 256 KBytes of 8 bits each. The 256 KBytes consist of an array of 1024 rows by 256 columns of bytes. The number of redundancy columns included in the die depends upon the number of defective cells the manufacturer, through experience and statistical analysis conducted for each manufacturing process predicts will be needed to replace defective die during wafer sort. As can be appreciated, the more redundancy cells that are available will increase product yield, however, there is a point of diminishing returns because the die would have to be larger, and thus more costly to manufacture, to accommodate a larger number of redundancy cells.

If there is determined at 26 that the dc parametrics test 18, the programmability test 20, the erasability test 22, or the ac functionality test 24 has identified a defective cell it is then determined at 28 whether there is an available redundancy with which the defective cell can be replaced. If there is an available redundancy the defect is corrected by replacing the column containing the defective cell at 30. The correction is done by disconnecting the defective column using special circuit logic and connecting the redundancy column using the special circuit logic. If there isn't an available redundancy to replace the defective cell the device is marked for discard at 32. The die that pass the wafer sort 12 are passed to assembly 14 where the wafer is sawed into individual die and the die that passed are packaged. After packaging the die are then passed to class test 16 where the packaged die are again subjected to dc parametrics testing 34, programmability testing 36, erasability testing 38, and ac functionality testing and ac speed reads 40. The programmability testing 36 algorithm is shown in FIG. 2 as indicated at 25. The above tests are basically the same, however, the tests performed at class test 16 are typically done at an elevated temperature.

If there is determined at 42 that the dc parametrics test 34, the programmability test 36, the erasability test 38 or the ac functionality tests and ac speed reads 40 has identified a defective cell it is then determined at 44 whether the defective cell is repairable. If the defective cell is repairable it is repaired at 46 and the necessary tests from class test 16 are repeated to ensure that the device has been properly repaired and is good.

If it is determined at 42 that the device is good the device is sorted as to speed as indicated at 48. If it is determined at 44 that the defective cell is not repairable the device is marked for discard as indicated at 50.

Referring now to FIG. 2 there is shown the programmability algorithm as used in the prior art and as used in both wafer sort 12 (FIG. 1) and class sort 16 (FIG. 1) in the prior art testing procedure. The programmability algorithm shown in FIG. 2 is the Flashrite™ programmability algorithm belonging to Advanced Micro Devices, Inc. As can be appreciated, any programmability algorithm could be used in the prior art method. The following description will apply to both the wafer sort 12 and the class test 16 with the exception that the tests during wafer sort are done on individual die while still in wafer form and in class test the tests are done on individual die after being packaged. In addition, the tests done during wafer sort are done at room temperature and the tests done during class test are done at an elevated temperature.

The test procedure is started at 52. $V_{PPH}$ is applied to the device at 54 and the pulsecount is set equal to zero at 56. The write program set-up command is at 58 with the write program command with address/data formatting=on at 60. There is a time out of 10 microseconds at 62 followed by a write program-verify command at 64 and a time out of 6 microseconds at 66. The data is read from the byte being programmed at 68. If the byte does not read 00H at 70 the pulsecount is incremented at 72. If it is determined that the pulsecount is equal to the maximum value at 74, $V_{PPL}$ is applied to the device at 76 and the die is marked as containing a defective cell at 78.

If it is determined that the pulsecount is not equal to the maximum value at 74 the programming sequence for the same byte is restarted at 58.

If it is determined that the byte reads 00H at 70 it is then determined at 80 whether the byte just tested was at the last address of the device. If it is determined that the byte was not at the last address, the address is incremented at 82 and the programming sequence for the new byte is initiated at 56. If it is determined that the byte was at the last address of the device, the write reset command is set at 84, $V_{PPL}$ is applied at 86 and the programming is completed as indicated at 88.

Referring again to FIG. 1, if the programming algorithm was being run during wafer sort 12, the testing sequence would step to the next test, and in this case the next step would be erasability testing 22. The defective cell information would be stored and would be accessed during step 26 and the sequence starting at step 28 would be initiated as discussed above.

If the programming algorithm was being run during class test 16 the testing sequence would step to the next test, and in this case the next step would be erasability testing 38. The defective cell information would be stored and would be accessed during step 42 and the sequence starting at step 44 would be initiated as discussed above.

Figure 3:
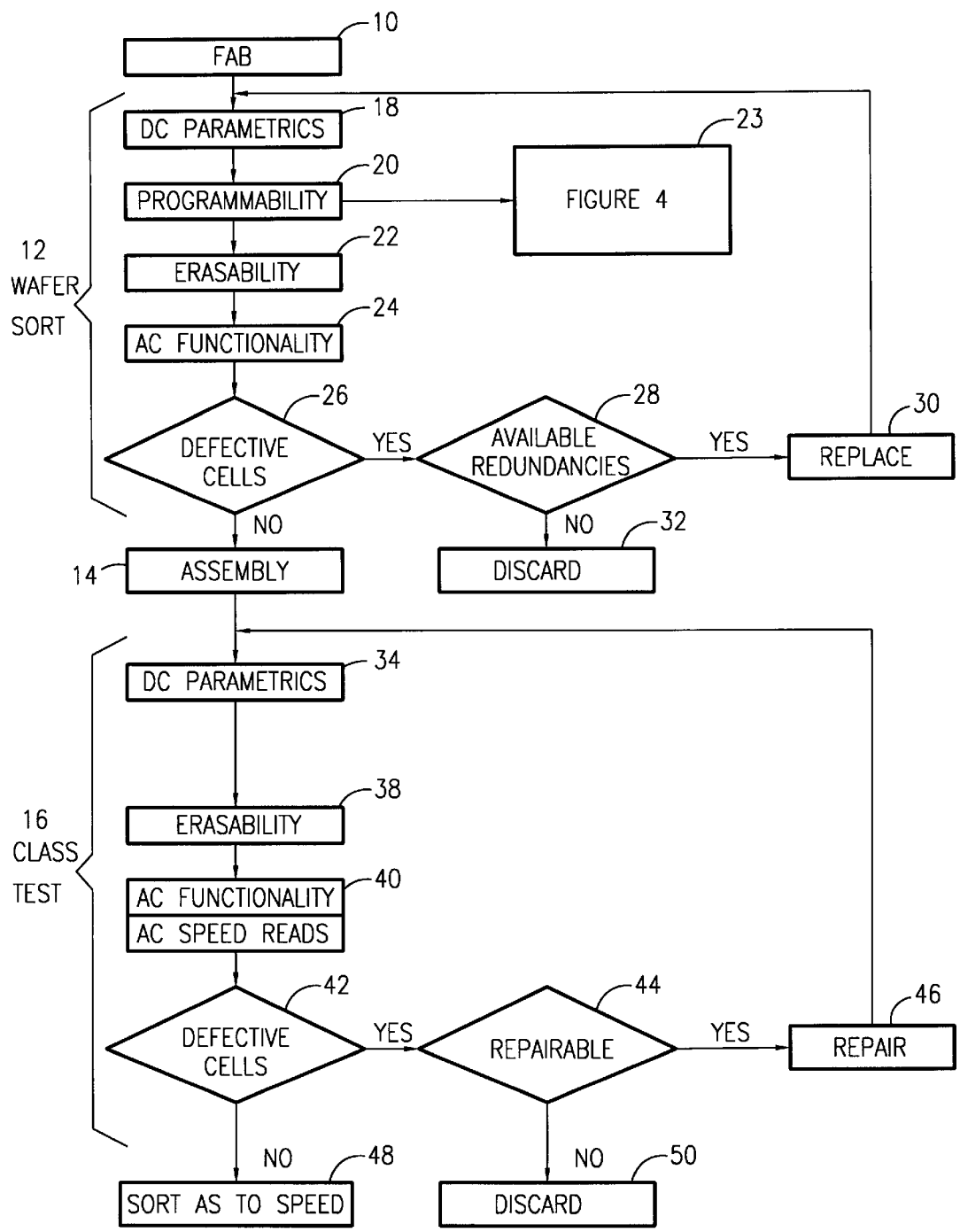
FIG. 3 shows the testing method of the present invention.

Referring now to FIG. 3 there is shown the overall flow diagram for Flash memory manufacturing and testing of the present invention. FIG. 3 is analogous to FIG. 1 and like steps are referenced with like numerals between FIGS. 1 and 3. As described above in the discussion of the process shown in FIG. 1, the manufacture of Flash memory devices can be informally divided into four overall processes. The first process is represented in FIG. 3 and fab 10 which represents the actual fabrication of the Flash memory device in wafer form. The next major process is referred to as wafer sort 12 which will be discussed below. The third major process is referred to as the assembly process 14 and represents the process in which the wafer is sawed into individual die and each non-defective die, as determined in wafer sort 12, is packaged. The fourth major process is referred to as class test 16 and will be discussed below.

The major tests performed in wafer sort 12 are the tests referred to as dc parametrics 18 for each die which include testing for dc continuity, shorts, leakage current, etc., the programmability 20 of each cell, the erasability 22 of each cell, and the ac functionality 24 of each cell. The programmability algorithm utilized in programmability 20 testing in wafer sort 12 is shown in FIG. 4 as represented by 23 and will be discussed below.

Referring again to FIG. 3, if there is determined at 26 that the programmability test 20, the erasability test 22, or the ac functionality test 24 has identified a defective cell it is then determined at 28 whether there is an available redundancy with which the defective cell can be replaced. If there is an available redundancy the defect is corrected by replacing the column containing the defective cell at 30. The correction is done by disconnecting the column containing the defective cell using special circuit logic and connecting the redundancy column using the special circuit logic. If there isn't an available redundancy to replace the defective cell the device is marked for discard at 32. The die that pass the wafer sort 12 are passed to assembly 14 where the wafer is sawed into individual die and the die that are not defective are packaged.

The prior art method as shown in FIGS. 1 and 2 require that packaged die have to be subjected to the same tests during class test 16 as performed in wafer sort 12 (FIG. 1). Referring now to FIG. 4 there is shown a new method of testing for the programmability of die still in wafer form and at room temperature that accurately screens die that would fail under elevated temperature testing such as that done in the prior art class test.

Figure 4B:
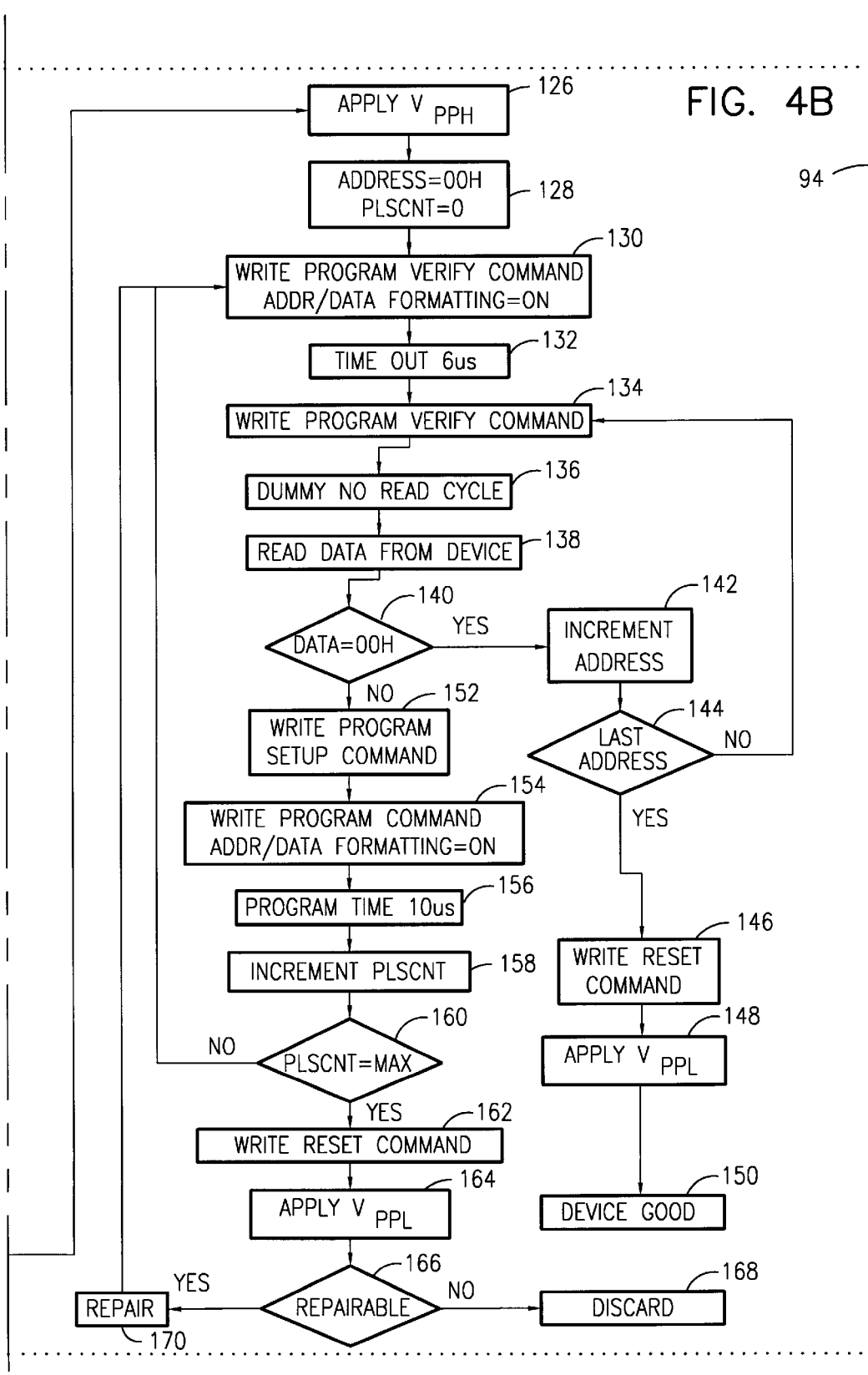
FIG. 4 shows the present invention methodology for testing for programming failures.

The new method of programmability testing shown in FIG. 4 is done in either two or three basic procedures. The first procedure is shown within dotted line 90. During the first procedure each byte is subjected to 1–5 programming pulses which is substantially lower than the standard number of programming pulses of 25 and at a $V_{PPH}$ voltage of 10.5–11 volts which is below the standard programming voltage of 12 volts. The voltage range of 10.5–11 volts is for a 12 volt memory device. This voltage range would be scaled for other voltage memory devices. For example, a 3 volt or a 5 volt memory device would have appropriately scaled voltages. During the first procedure there is no verify step. Each byte is subjected to the same number of programming pulses. The second procedure is within dotted line 92 during which the $V_{CC}$ margin of the cells are verified to be above a minimum value of 6.5–8 volts. Cells with margins below the minimum value are removed and replaced with good cells during the third procedure shown within dotted line 94.

The first procedure starts with the application of $V_{PPH}$ at 96. The beginning address and the initial pulsecount is set at 98. Write program setup command is set at 100 and the write program command with address/data formatting=on is set at 102. There is a program time=10 microseconds at 104, a write reset command at 106, and a time out of 1–3 microseconds at 108. A determination is made at 110 whether the byte being tested is at the last address of the device. If it isn't the last address the address is incremented at 112 and the process jumps back to the write program setup command at 100. If it is the last address the pulsecount is incremented at 114, it is determined at 116 whether the pulsecount is at a maximum. If the pulsecount is not at the maximum the process jumps back to the write program setup command at 100. If the pulsecount=maximum at 116 the process continues to the write reset command at 118. $V_{PPL}$ is then set at 120 and the second procedure begins at 122 with a $V_{CC}$ margin read on all bits are verified to be above a minimum value of 6.5–8 volts. If there are no defective bits indicated at 124 the device is determined to be good as indicated at 126. If there are defective bits indicated at 124 the process jumps to the third procedure and $V_{PPH}$ is applied at 126. The initial address and initial pulsecount is set at 128. The write program verify command with address/data formatting=on is set at 130 followed by a time out of 6 microseconds at 132. The write program verify command is set at 134 followed by a dummy no read cycle at 136 and a read data from the byte being programmed at 138. The data is verified at 140 and if the data=00H, the address is incremented at 142 and at 144 is determined if the byte just read was at the last address of the device. If the byte just read was at the last address, the write reset command is set at 146, VPPL is applied at 148, and the die is marked as passing the programmability test at 150. If it is determined at 144 that the byte just tested was not at the last address the process jumps to the write program verify command at 134 and the next byte is tested.

If it is determined at 140 that the byte just tested does not read 00H, the write program setup command is set at 152, the write program command with address/data formatting= on is set at 154, followed by the setting of the program time=10 microseconds at 156. The pulsecount is incremented at 158 and it is determined at 160 if the pulsecount is at the maximum, which is set in the range of 10–15 programming pulses. If it is determined at 160 that the pulsecount is not at the maximum, the process jumps to the write program verify command with address/data formatting=on at 130 and the byte being programmed is subjected to another programming sequence. If it is determined at 160 pulsecount is at the maximum, the write reset command is set at 162, $V_{PPL}$ is applied at 164. Since the die being tested as not been successfully programmed within the allotted programming pulsecounts there is a defective cell which has been recorded. It is then determined at 166 if the device is repairable and if it is not, the die is marked for discard at 168. If the die is repairable, the die is repaired at 170 and process jumps to the write program verify command with address/data formatting=on at 130.

Referring now to FIG. 3 the die that are marked as being good at either step 150 or 126 (FIG. 4) and which survive the erasability test 22 and the ac functionality test 24 would be passed to the assembly step 14. After being sawed into individual die and packaged the die are passed to class test 16. The tests that are conducted during class test 16 are dc parametrics test 34, erasability tests 38 and the ac functionality tests 40 which include ac speed reads. If it is determined at 42 that there is a defective cell it is then determined at 44 whether the defective cell is repairable. If the defective cell is repairable it is repaired at 46 and the necessary tests from class test 16 are repeated to ensure that the device has been properly repaired. Because the programmability tests do not have to be rerun there is a savings in time during class test 16.

The foregoing description of the preferred embodiment of the present invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What we claim is:

1. A method of screening out die containing memory cells that would be rejected during hot temperature programming tests, wherein the screening is accomplished during wafer sort conducted at room temperature, the method comprising:

subjecting all die containing memory cells, during a wafer sort at room temperature, to a first selected number of programming pulses having a selected voltage lower than a standard programming voltage to program said memory cells with said programming pulses; and verifying whether all of the memory cells have been programmed by said step of subjecting by performing a margin read on all bits of each memory cell, wherein the margin read is performed at a selected voltage wherein all die containing memory cells that do not have all bits above a minimum voltage would be considered the die containing memory cells that would be rejected during the hot temperature programming tests and marked as defective.

2. The method of claim 1, wherein the step of subjecting the memory cells to a first selected number of programming pulses having a selected voltage lower than a standard programming voltage is accomplished by the step of applying a programming voltage of 10.5 to 11 volts.

3. The method of claim 2, wherein the step of performing a margin read on all bits of each memory cell at a selected voltage is accomplished by verifying that all bits arc above a minimum voltage of 6.5 to 8 volts.

4. The method of claim 3, further comprising the step of subjecting the die that have been marked as defective to a second sequence of programming pulses at the selected voltage lower than a standard programming voltage.

5. The method of claim 4, wherein the step of subjecting the die that have been marked as defective to a second sequence of programming pulses is accomplished at a voltage of 10.5 to 11 volts.

6. The method of claim 5, wherein said first selected number of programming pulses is 1 to 5 pulses.

7. The method of claim 6, wherein said second sequence of programming pulses comprises a second selected number of programming pulses.

8. The method of claim 7, wherein said second selected number of programming pulses is 10 to 15 pulses.

9. The method of claim 8, further comprising the step of verifying that die have been programmed during the second sequence of programming pulses.

10. The method of claim 9, further comprising the step of marking die that do not verify as having been programmed during the second sequence of programming pulses.

11. The method of claim 10, further comprising the step of determining whether the marked die are repairable.

12. The method of claim 11, further comprising the step of repairing the repairable marked die that do not verify as having been programmed during the second sequence of programming pulses.

13. The method of claim 12, further comprising the step of reprogramming the repaired die.

14. The method of claim 3, further comprising the step of marking die that are verified as having all bits above a minimum voltage as being good.

15. The method of claim 9, wherein the step of verifying includes a short duration dummy read cycle.

16. The method of claim 15, wherein said short duration dummy read cycle has a duration in the range of 100 nanoseconds to 1 microsecond.

* * * * *